United States Patent
Argoitia

(10) Patent No.: US 12,486,404 B2
(45) Date of Patent: Dec. 2, 2025

(54) PIGMENT INCLUDING A METAL CORE, ORGANIC LAYER, AND AN INORGANIC LAYER

(71) Applicant: VIAVI SOLUTIONS INC., Chandler, AZ (US)

(72) Inventor: Alberto Argoitia, Santa Rosa, CA (US)

(73) Assignee: VIAVI SOLUTIONS INC., Chandler, AZ (US)

( * ) Notice: Subject to any disclaimer, the term of this patent is extended or adjusted under 35 U.S.C. 154(b) by 0 days.

(21) Appl. No.: 18/415,154

(22) Filed: Jan. 17, 2024

(65) Prior Publication Data
US 2024/0199885 A1 Jun. 20, 2024

Related U.S. Application Data

(63) Continuation of application No. 17/708,795, filed on Mar. 30, 2022, now Pat. No. 11,898,041.

(51) Int. Cl.
C09C 1/00 (2006.01)
C09C 3/06 (2006.01)
C09C 3/12 (2006.01)

(52) U.S. Cl.
CPC ............ C09C 1/0066 (2013.01); C09C 3/063 (2013.01); C09C 3/12 (2013.01); C09C 2200/1004 (2013.01); C09C 2200/407 (2013.01); C09C 2200/505 (2013.01)

(58) Field of Classification Search
CPC .......... C09C 1/0066; C09C 3/063; C09C 3/12
See application file for complete search history.

(56) References Cited

U.S. PATENT DOCUMENTS

| | | | |
|---|---|---|---|
| 9,028,724 B2 | 5/2015 | Son et al. | |
| 11,655,374 B2 | 5/2023 | Liang | |
| 2003/0177943 A1 | 9/2003 | Auweter et al. | |
| 2003/0190473 A1* | 10/2003 | Argoitia ............... | G02B 5/1861 |
| | | | 428/402 |
| 2004/0146641 A1 | 7/2004 | Hobbs et al. | |
| 2005/0186423 A1 | 8/2005 | Johnson et al. | |
| 2006/0089422 A1 | 4/2006 | Vasudevan | |
| 2008/0249209 A1 | 10/2008 | Trummer et al. | |

(Continued)

FOREIGN PATENT DOCUMENTS

| | | |
|---|---|---|
| CN | 1687252 A | 10/2005 |
| CN | 1756805 A | 4/2006 |

(Continued)

OTHER PUBLICATIONS

Corwin, Introductory Chemistry: Concepts and Critical Thinking, Worked Example Exercise 14.1-14.11, 6th Edition, Pearson education, 2011, pp. 1-17.

*Primary Examiner* — Pegah Parvini
(74) *Attorney, Agent, or Firm* — Mannava & Kang, P.C.

(57) ABSTRACT

A pigment, including a flake including a metal core having a first surface and a second surface, a first dielectric layer interfacing with a first surface of the metal core, and a second dielectric layer interfacing with a second surface of the metal core; a first inorganic layer encapsulating the flake; and an organic layer encapsulating the first organic layer is disclosed. A colorant composition including the pigment is also disclosed. A method of making the pigment, and a method of making a colorant composition are also disclosed.

19 Claims, 10 Drawing Sheets

(56) References Cited

U.S. PATENT DOCUMENTS

| | | |
|---|---|---|
| 2009/0264575 A1 | 10/2009 | Henglein et al. |
| 2012/0065298 A1 | 3/2012 | Setoguchi |
| 2013/0251771 A1* | 9/2013 | Shimizu .................. C09D 7/62 106/459 |
| 2014/0050768 A1 | 2/2014 | Struck et al. |
| 2018/0171151 A1 | 6/2018 | Argoitia et al. |
| 2020/0283637 A1 | 9/2020 | Book et al. |
| 2020/0325341 A1 | 10/2020 | Liang |
| 2023/0250293 A1 | 8/2023 | Liang |

FOREIGN PATENT DOCUMENTS

| | | |
|---|---|---|
| CN | 101098939 A | 1/2008 |
| CN | 103709833 A | 4/2014 |
| CN | 107419563 A | 12/2017 |
| TW | 211026 | 8/1993 |
| TW | 200621910 A | 7/2006 |
| WO | 2005037470 | 4/2005 |
| WO | 2014005753 A1 | 1/2014 |
| WO | 2016094245 A1 | 6/2016 |

* cited by examiner

PIGMENT INCLUDING A METAL CORE, ORGANIC LAYER, AND AN INORGANIC LAYER

PRIORITY

This patent application is a continuation under 35 U.S.C. § 120 of co-pending U.S. patent application Ser. No. 17/708,795, filed Mar. 30, 2022, the disclosure of which is hereby incorporated by reference in its entirety.

FIELD OF THE INVENTION

The present disclosure generally relates to a pigment including a flake including a metal core having a first surface and a second surface, a first dielectric layer interfacing with a first surface of the metal core, and a second dielectric layer interfacing with a second surface of the metal core; a first inorganic layer encapsulating the flake; and an organic layer encapsulating the first organic layer. The pigment can be included in a colorant composition with a liquid medium. A method of making the pigment, and a method of making the colorant composition are also disclosed.

BACKGROUND OF THE INVENTION

Special effect pigments, such as an aluminum based pigments, can include inorganic brittle outerlayers. During the application of these inorganic brittle outerlayers, cracks or other defects (e.g., pinholes) are known to form that compromise the pigment. For example, the cracks can allow elements, e.g., water, other liquids, or gases to diffuse, to reach the metal layer, such as an aluminum surface. Additionally, these elements can propagate and physically damage external layers of the pigment from within, for example, by causing oxidation and delamination. These defects have been observed in five-layer designs as well as nine layer-double cavity designs.

What is needed is a pigment that can be encapsulated with a rigid inorganic layer, but also with a flexible organic layer that can help minimize at least one of the following: propagation of defects, such as cracks; oxidation of a metal core; delamination of the pigment. The pigment can also provide at least one of the following: diffractive optical effects, interference optical effects; reduced or stabilized gassing; passivated metal core, etc.

BRIEF DESCRIPTION OF THE DRAWINGS

Features of the present disclosure are illustrated by way of example and not limited in the following figure(s), in which like numerals indicate like elements, in which.

SUMMARY OF THE INVENTION

Figure 1:
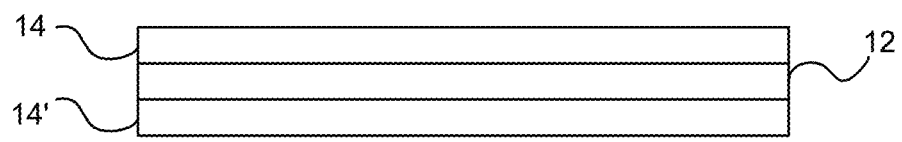
FIG. 1 illustrates a flake according to an aspect of the invention.

In an aspect, there is disclosed a pigment including a flake including a metal core having a first surface and a second surface, a first dielectric layer interfacing with a first surface of the metal core, and a second dielectric layer interfacing with a second surface of the metal core; a first inorganic layer encapsulating the flake; and an organic layer encapsulating the first organic layer.

In another aspect, there is disclosed method of making a pigment, including, providing a flake; applying a first inorganic layer by a sol-gel process to fully encapsulate the flake; and applying an organic layer to fully encapsulate the flake and the first inorganic layer.

Additional features and advantages of various embodiments will be set forth, in part, in the description that follows, and will, in part, be apparent from the description, or can be learned by the practice of various embodiments. The objectives and other advantages of various embodiments will be realized and attained by means of the elements and combinations particularly pointed out in the description herein.

DETAILED DESCRIPTION OF THE INVENTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Additionally, the elements depicted in the accompanying figures may include additional components and some of the components described in those figures may be removed and/or modified without departing from scopes of the present disclosure. Further, the elements depicted in the figures may not be drawn to scale and thus, the elements may have sizes and/or configurations that differ from those shown in the figures.

It is to be understood that both the foregoing general description and the following detailed description are exemplary and explanatory only, and are intended to provide an explanation of various embodiments of the present teachings. In its broad and varied embodiments, disclosed herein is a pigment including a flake 10 including a metal core 12 having a first surface and a second surface, a first dielectric layer 14 interfacing with a first surface of the metal core 12, and a second dielectric layer 14' interfacing with a second surface of the metal core 12; a first inorganic layer 16 encapsulating the flake 10; and an organic layer 18 encapsulating the first inorganic layer 16. In this manner, the pigment includes a multilayer encapsulation coating around the flake 10 that can provide a difficult pathway for elements to diffuse through in order to arrive at the metal core 12. The multilayer encapsulation coating can provide multiple interfaces with different materials that can inhibit and/or prevent diffusion of elements, such as gases, liquids, and/or molecules, through the multilayers. Additionally, as described more fully below, the multilayer encapsulation coating can include two or more layers of inorganic material 16, 20 and/or one or more layers of organic material 18. In an aspect, the multilayer encapsulation coating can include a flexible organic layer 18 between two rigid inorganic layers 16, 20. This arrangement can inhibit the propagation of a defect, such as a crack, from extending from a rigid inorganic layer 16, 20 to other layers of the multilayer encapsulation coating, and to the metal core 12. Additionally, the pigment can include a reduced number or thickness of brittle inorganic layers 16, 20, as compared to other encapsulated flakes, that can be susceptible to the propagation of defects that occur within the pigment and extend towards the encapsulating layer. In another aspect, the outermost inorganic layer 20 of the multilayer encapsulation coating can include a functional material, for example, present in a functional layer.

The pigment disclosed herein can be used in waterborne automobile applications. In particular, the pigment can be combined with a liquid medium to produce a colorant composition, such as paint or ink. The liquid medium can be water or a solvent (inorganic or organic).

FIG. 1 illustrates a flake 10, which can be a multilayered structure, including a metal core 12 having a first surface and a second surface. The metal core 12 can be a layer of a metal, non-metal, or metal alloy. The metal core 12 can include any materials that have reflective characteristics in the desired spectral range, for example, ranging from 5% to 100% in the desired spectral range. An example of a reflective material can be aluminum, which has good reflectance characteristics, is inexpensive, and is easy to form into or deposit as a thin layer. Non-limiting examples of reflective opaque material for use in the metal core 12 include aluminum, copper, silver, gold, platinum, palladium, nickel, cobalt, niobium, chromium, tin, iron, and combinations or alloys of these or other metals can be used as the pigment. In an aspect, the metal core 12 can be a white or light colored metal. In other examples, the metal core 12 can include, but is not limited to, the transition and lanthanide metals and combinations thereof; as well as metal carbides, metal oxides, metal nitrides, metal sulfides, a combination thereof, or mixtures of metals and one or more of these materials. In an aspect, the metal core 12 can include a transparent or semi-transparent material chosen from glass, silica, titania, alumina, natural mica, synthetic mica, and bismuth oxychloride. In another aspect, the metal core 12 can include a metalloid material chosen from silicon, germanium, and molybdenum.

The metal core 12 can have one or more interfaces with a dielectric layer, such as a first dielectric layer 14 and/or a second dielectric layer 14'. A first dielectric layer 14 can interface with a first surface of the metal core 12. A second dielectric layer 14' can interface with a second surface of the metal core 12. The dielectric layer 14, 14'.

The dielectric layer 14, 14' can be formed to have an effective optical thickness for a particular wavelength. The dielectric layer 14, 14' can be optionally clear, or can be selectively absorbing so as to contribute to the color effect of a pigment. The optical thickness is a well-known optical parameter defined as the product $\eta d$, where $\eta$ is the refractive index of the layer and $d$ is the physical thickness of the layer. Typically, the optical thickness of a layer is expressed in terms of a quarter wave optical thickness (QWOT) that is equal to $4\eta rf/\lambda$, where $\lambda$ is the wavelength at which a QWOT condition occurs. The optical thickness of the dielectric layer can range from about 2 QWOT at a design wavelength of about 400 nm to about 9 QWOT at a design wavelength of about 700 nm, and for example about 2-6 QWOT at 400-700 nm, depending upon the color shift desired. The dielectric layer 14, 14' can have a physical thickness of about 10 nm to about 800 nm, and for example from about 100 nm to about 650 nm, depending on the color characteristics desired.

Suitable materials for a dielectric layer 14, 14' can include those having a "high" index of refraction, defined herein as greater than about 1.65, as well as those have a "low" index of refraction, which is defined herein as about 1.65 or less. The dielectric layer 14, 14' can be formed of a single material or with a variety of material combinations and configurations. For example, the dielectric layer 14, 14' can be formed of only a low index material or only a high index material, a mixture or multiple sublayers of two or more low index materials, a mixture or multiple sublayers of two or more high index materials, or a mixture or multiple sublayers of low index and high index materials. In addition, the dielectric layer 14, 14' can be formed partially or entirely of high/low dielectric optical stacks. When a dielectric layer 14, 14' is formed partially with a dielectric optical stack, the remaining portion of the dielectric layer 14, 14' can be formed with a single material or various material combinations and configurations as described above.

Non-limiting examples of suitable high refractive index materials for the dielectric layer 14, 14' include zinc sulfide (ZnS), zinc oxide (ZnO), zirconium oxide ($ZrO_2$), titanium dioxide ($TiO_2$), diamond-like carbon, indium oxide ($InO_3$), indium-tin-oxide (ITO), tantalum pentoxide ($Ta_2O_5$), cerium oxide ($CeO_2$), yttrium oxide ($Y_2O_3$), europium oxide ($Eu_2O_3$), iron oxides such as (II)diiron(III) oxide ($FeO_4$) and ferric oxide ($Fe_2O$), hafnium nitride (HfN), hafnium carbide (HfC), hafnium oxide ($HfO_2$), lanthanum oxide ($La_2O_3$), magnesium oxide (MgO), neodymium oxide ($Nd_2O_3$), praseodymium oxide ($Pr_6O_{11}$), samarium oxide ($Sm_2O_3$), antimony trioxide ($Sb_2O_3$), silicon monoxide (SiO), selenium trioxide ($Se_2O_3$), tin oxide ($SnO_2$), tungsten trioxide (WO), combinations thereof, and the like.

Non-limiting examples of suitable low refractive index materials for the dielectric layer 14, 14' includes silicon dioxide ($SiO_2$), aluminum oxide ($Al_2O_3$), metal fluorides such as magnesium fluoride ($MgF_2$), aluminum fluoride ($AlF_3$), cerium fluoride ($CeF_3$), lanthanum fluoride ($LaF_3$), sodium aluminum fluorides (e.g., $Na_3AlF_6$, $Na_5Al_3F_{14}$), neodymium fluoride ($NdF_3$), samarium fluoride ($SmF_3$), barium fluoride ($BaF_2$), calcium fluoride ($CaF_2$), lithium fluoride (LiF), combinations thereof, or any other low index material having an index of refraction of about 1.65 or less. For example, organic monomers and polymers can be utilized as low index materials, including dienes or alkenes such as acrylates (e.g., methacrylate), perfluoroalkenes, polytetrafluoroethylene (Teflon), fluorinated ethylene propylene (FEP), combinations thereof, and the like.

The dielectric layer 14, 14' can include a host material, which can be any suitable medium. The host material can be chosen from an organic polymer, an inorganic polymer, and a composite material. Non-limiting examples of the organic polymer include thermoplastics, such as polyesters, polyolefins, polycarbonates, polyamides, polyimides, polyurethanes, acrylics, acrylates, polyvinylesters, polyethers, polythiols, silicones, fluorocarbons, and various co-polymers thereof; thermosets, such as epoxies, polyurethanes, acrylates, melamine formaldehyde, urea formaldehyde, and phenol formaldehyde; and energy curable materials, such as acrylates, epoxies, vinyls, vinyl esters, styrenes, and silanes. Non-limiting examples of inorganic polymers includes silanes, siloxanes, titanates, zirconates, aluminates, silicates, phosphazanes, polyborazylenes, and polythiazyls.

The polymer chains in the host material can be crosslinked and cured. Non-limiting examples include photoinduced polymerization, such as free radical polymerization, spectrally sensitized photoinduced free radical polymerization, photoinduced cationic polymerization, spectrally sensitized photoinduced cationic polymerization, and photoinduced cycloaddition; electron beam induced polymerization, such as electron beam induced free radical polymerization, electron beam induced cationic polymerization, and electron beam induced cycloaddition; and thermally induced polymerization, such as thermally induced cationic polymerization. Non-limiting examples of a curing process include a non-radical cure system, ultraviolet light, visible light, infrared, and electron beam. In an aspect, the host material can be mechanical energy dissipating.

The host material can include additives dispersed in the host material. The additives can include, but are not limited to, colorants, such as dyes or pigments; quantum dots; micelles; chalcogenides; leveling agents, such as a polyacrylate; photoinitiators, such as a phosphineoxide; an oxygen inhibition mitigation composition; a defoamer; wetting aids; dispersants; curing agent; hardener; antioxidants; and combinations thereof. The dielectric layer 14, 14' can also include a solvent.

The metal core 12 can include a third surface and/or a fourth surface that does not interface with a dielectric layer 14, 14'. For example, the dielectric layer does not encapsulate the metal core 12.

In another aspect, the flake 10 can further include an absorber layer that interfaces with a dielectric layer 14, 14'. For example, the flake 10 can further include a first absorber layer that interfaces with the first dielectric layer 14, and a second absorber layer that interfaces with the second dielectric layer 14'. In an aspect, the metal core 12 does not interface with a first absorber layer and/or a second absorber layer. The absorber layer does not encapsulate the metal core 12.

The flake 10 can include a three-layer structure of dielectric 14'/metal core 12/dielectric 14. The flake 10 can include a five-layer structure of absorber/dielectric 14'/metal core 12/dielectric 14/absorber. The flake 10 can include a single cavity or a double cavity. The flake 10 can be symmetric with mirrored layers on each side of the metal core 12. The flake 10 can be asymmetric with different layers on each side of the metal core 12.

Figure 2:
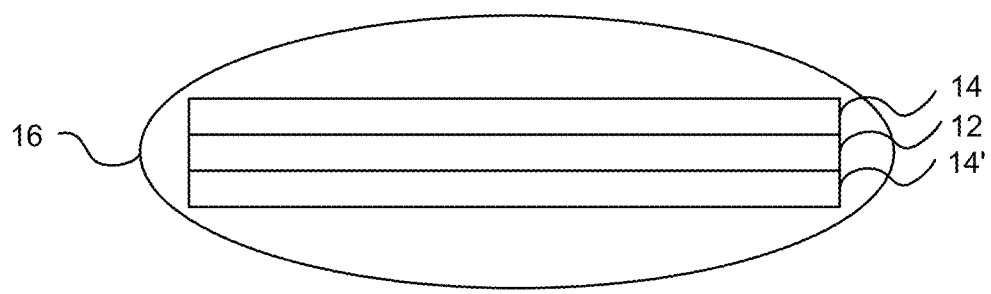
FIG. 2 illustrates a pigment according to an aspect of the invention.

As shown in FIG. 2, a first inorganic layer 16 can encapsulate the flake 10. In an aspect, the first inorganic layer 16 can interface with the flake 10. For example, the third surface and/or the fourth surface (e.g., side surfaces) of the metal core 12 can interface with the first inorganic layer 16. Additionally, two or more surfaces of the dielectric layer 14, 14' can interface with the first inorganic layer 16.

The first inorganic layer 16 can include any inorganic material. Non-limiting examples of inorganic materials include oxides, nitrides, carbides, sulfides, fluorides, chlorides, bromides, compounds thereof, or combinations thereof. In an example, the first inorganic layer 16 can be a layer of silica, titania, alumina, zirconia, or combinations thereof. The first inorganic layer 16 can have a negative or positive charge and can be attracted to a positive or negative charge of the organic layer 18 during the encapsulating process.

The first inorganic layer 16 can be applied using any encapsulating techniques. In an aspect, the first inorganic layer 16 can be applied to the flake 10 using sol-gel technology. In another aspect, the first inorganic layer 16 does not include a functional material because the functional material can inhibit attachment to the organic layer 18. In another aspect, the first inorganic layer 16 can include a functional material to improve an affinity to the organic layer 18.

The first inorganic layer 16 can be applied at a thickness ranging from about 0.5 nm to about 100 nm; for example, from about 5 nm to about 70 nm; as a further example, from about 10 nm to about 67 nm; and from about 10 nm to about 50 nm; and about 20 nm to about 45 nm. In an aspect, the first inorganic layer 16 can be a 20 nm layer of silica.

Figure 3:
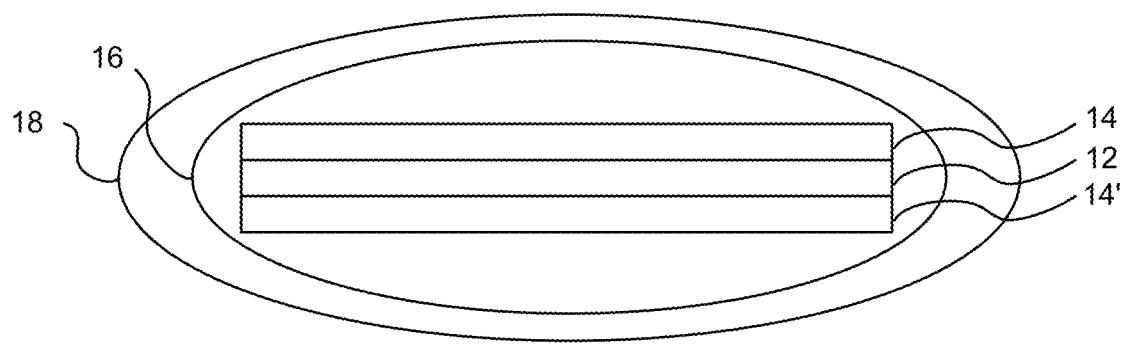
FIG. 3 illustrates a pigment according to another aspect of the invention.

As shown in FIG. 3, the organic layer 18 can encapsulate the first inorganic layer 16. In an aspect, the organic layer 18 can interface with the first inorganic layer 16.

The organic layer 18 can be a single layer, a bilayer, or a multilayer structure. In an aspect, the organic layer 18 can be a multilayer, such as a bilayer, including a first organic layer interfacing with a second organic layer, in which the first organic layer and the second organic layer are different. In an aspect, the organic layer 18 can be a multilayer structure including alternating layers of a first organic layer interfacing with a second organic layer, in which the first organic layer and the second organic layer are different from one another. For example, the organic layer 18 can include three layers of the first organic layer alternated with two layers of the second organic layer. In an aspect, the organic layer can be a multilayer structure including from 1 to n organic layers, in which n is an integer greater than 1, e.g., a first organic layer, a second organic layer, a third organic layer, . . . an n organic layer, in which each layer is different from the other. In an aspect, the bilayer and/or multilayer structure of the organic layer 18 does not include additional non-organic layers interleaved therebetween The organic layer 18 can include any organic material. Non-limiting examples of organic material include monomers, polymers, and co-polymers. The term "polymer" refers to a chemical compound formed of a plurality of repeating structural units referred to as monomers. Polymers often are formed by a polymerization reaction in which the plurality of structural units become covalently bonded together. When the monomer units forming the polymer all have the same chemical structure, the polymer is a homopolymer. When the polymer includes two or more monomer units having different chemical structures, the polymer is a copolymer. One example of a type of copolymer is a terpolymer, which includes three different types of monomer units. The co-polymer can include two or more different monomers randomly distributed in the polymer (e.g., a random co-polymer). Alternatively, one or more blocks containing a plurality of a first type of monomer can be bonded to one or more blocks containing a plurality of a second type of monomer, forming a block copolymer. A single monomer unit can include one or more different chemical functional groups.

The polymer can be selected from: polyurethanes (including elastomeric polyurethanes, thermoplastic polyurethanes (TPUs), and elastomeric TPUs), polyesters, polyethers, polyamides, vinyl polymers (e.g., copolymers of vinyl alcohol, vinyl esters, ethylene, acrylates, methacrylates, styrene, and so on), polyacrylonitriles, polyphenylene ethers, polycarbonates, polyureas, polystyrenes, co-polymers thereof (including polyester-polyurethanes, polyether-polyurethanes, polycarbonate-polyurethanes, polyether block polyamides (PEBAs), and styrene block copolymers), and any combination thereof, as described herein. The polymer can include one or more polymers selected from the group consisting of polyesters, polyethers, polyamides, polyurethanes, polyolefins copolymers of each, and combinations thereof. In an aspect, the organic layer 18 can include a polymer.

The organic layer 18 can also include one or more polyelectrolytes, such as a polycation or a polyanion. Non-limiting examples of a polyelectrolyte include polyallylamine hydrochloride, polysodium 4-styrenesulfonate, poly(sodium styrene sulfonate), polyacrylic acid, polyethyleneimine, carboxymethylcellulose, polyphosphates, polyacrylamides, gelatins, chitosan, carrageenan, pectin, and combinations thereof. In an aspect, the organic layer 18 can include a polyelectrolyte chosen from polyallylamine hydrochloride, polysodium 4-styrenesulfonate, and combinations thereof.

The organic layer 18 can include alternating layers of different polyelectrolytes; for example, alternating layers of polyallylamine hydrochloride and polysodium 4-styrenesulfonate. In this manner, the organic layer 18 can be multiple alternating layers of a charged material. For example, a first organic layer 18 can include a polyelectrolyte, such as polyallylamine hydrochloride, having a positive charge, which can have an affinity to a negative charge of the inorganic layer 16, such as a silica. A second organic layer 18 can include a polyelectrolyte, such as polysodium 4-styrenesulfonate, having a negative charge, which can have an affinity to the positive charge of the first organic layer 18. The multiple alternating layers of charged material in the organic layer 18 can create a stronger interface between the inorganic layer 16 and the organic layer 18, and within the multiple layers of the organic layer 18, thereby minimizing oxidation. The organic layer 18 can include a variety of different polycations and polyanions in any alternated combination suitable for the application. In an aspect, the organic layer 18 can be a multilayer structure of PAH/PSS/PAH/PSS/PAH.

The organic layer 18 can also include a colorant, such as a dye or pigment. The colorant can be a nanoparticle. Any dye or pigment recognized in the Colour Index™ published by the Society of Dyers and Colourists can be used, such as those with the designation "C.I. Pigment". Non-limiting examples of colorants also include carbon, graphite, perylene, perinone, quinacridone, pyrrole, quinacridonequinone, anthrapyrimidine, anthraquinone, anthanthrone, benzimidazolone, disazo condensation, azo, quinolones, xanthene, azomethine, quinophthalone, indanthrone, phthalocyanine, triarylcarbonium, dioxazine, aminoanthraquinone, isoindoline, diketopyrrolopyrrole, thioindigo, thiazineindigo, isoindolinone, pyranthrone, isoviolanthrone, miyoshi methane, triarylmethane, and mixtures thereof. An organic colorant can also be cobalt green, cobalt blue, Prussian blue, and manganese violet.

The organic layer 18 can be applied using any encapsulating techniques. In an aspect, the organic layer 18 can be applied to the flake 10 using layer-by-layer technology.

The organic layer 18 can be applied at a total thickness ranging from about 0.5 nm to about 100 nm; for example, from about 5 nm to about 70 nm; as a further example, from about 10 nm to about 67 nm; and from about 10 nm to about 50 nm; and about 20 nm to about 45 nm. The thickness of a single organic layer 18 or a multilayer organic layer 18 can be tunable by changing the molecular weight of the polyelectrolytes or with the ionic strength of the solution during the encapsulation process.

Figure 4:
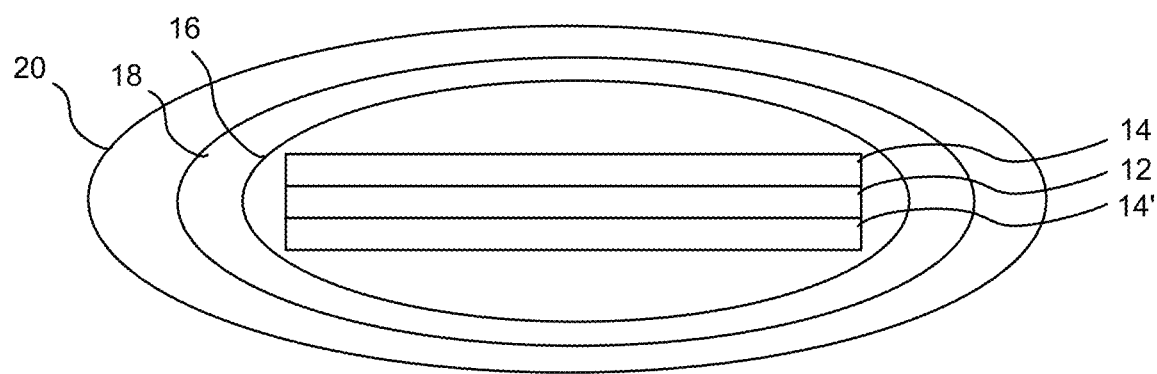
FIG. 4 illustrates a pigment according to another aspect of the invention.

As shown in FIG. 4, a second inorganic layer 20 can encapsulate (fully) the flake 10. In an aspect, the second inorganic layer 20 can interface with the organic layer 18.

Like the first inorganic layer 16, the second inorganic layer 20 can include any inorganic material. Non-limiting examples of inorganic materials include oxides, nitrides, carbides, sulfides, fluorides, phosphides, chlorides, compounds thereof, or combinations thereof. In an example, the second inorganic layer 20 can be a layer of silica, titania, alumina, zirconia, or combinations thereof. The second inorganic layer 20 can be negative or positive charged during the encapsulation process and can be attracted to a positive or negative charge of the organic layer 18.

The second inorganic layer 20 can be applied using any encapsulating techniques. In an aspect, the second inorganic layer 20 can be applied to the organic layer 18 using sol-gel technology.

In an aspect, the second inorganic layer 20 can include a functional material. The functional material can be an organosilane. The organosilane can provide a hydrophobic property to the second inorganic layer. Additionally, a second inorganic layer 20 with a functional material can increase bonding with a water-based binder, which can be used in colorant compositions.

In another aspect, the second inorganic layer 20 can include a major amount of an inorganic material and a minor amount of an organic material. It is to be understood that a major amount means greater than 50% by weight, relative to the total weight of the second inorganic layer 20.

The second inorganic layer 20 can be applied at a thickness ranging from about 0.5 nm to about 100 nm; for example, from about 5 nm to about 70 nm; as a further example, from about 10 nm to about 67 nm; and from about 10 nm to about 50 nm; and about 20 nm to about 45 nm. In an aspect, the second inorganic layer 20 can be a 67 nm layer of silica with an organosilane functional material.

There is also disclosed method of making a pigment, comprising: providing a flake 10 (FIG. 1); applying a first inorganic layer 16 by a sol-gel process to fully encapsulate the flake 10 (FIG. 2); and applying an organic layer 18 to fully encapsulate the flake 10 and the first inorganic layer 16 (FIG. 3). The method also comprises, after applying the organic layer 18, applying a second inorganic layer 20 to fully encapsulate the flake 10, the first inorganic layer 16, and the organic layer 18 (FIG. 4). The first inorganic layer 16 and/or the second inorganic layer 20 can be negative or positive charged during the encapsulation process and can be attracted to a positive or negative charge of the organic layer 20.

The second inorganic layer 20 can include a functional material that could also be organic. The second inorganic layer 20 can be applied using a layer-by-layer technology. The second inorganic layer 20 can include a major amount of an inorganic material and a minor amount of an organic material. It is to be understood that a major amount means greater than 50% by weight, relative to the total weight of the second inorganic layer 20.

The organic layer 18 can be applied using a layer-by-layer technology. The pigment can include multiple interfaces to reduce propagation of defects and can increase the diffusion path of elements.

A method of making a colorant composition comprises mixing a pigment with a liquid medium. The colorant composition can be applied to a substrate, such as plastic, paper, metal, glass, etc.

In another aspect, there is disclosed a method of making a pigment comprising a flake 10; applying a first organic layer 18 to fully encapsulate the flake 10; and applying an inorganic layer 16 to fully encapsulate the flake 10 and the first organic layer 18. The method also comprises, after applying the inorganic layer 16, applying a second organic layer 18' to fully encapsulate the flake 10, the first inorganic layer 16, and the first organic layer 18. The first and/or second organic layer 18, 18' can be applied using a layer-by-layer process as described above. The inorganic layer 16 can be applied using a sol gel process.

There is also disclosed a pigment including a flake 10 including a metal core 12 having a first surface and a second surface, a first dielectric layer 14 interfacing with a first surface of the metal core 12, and a second dielectric layer 14' interfacing with a second surface of the metal core 12; a first organic layer 18 encapsulating the flake 10; and an inorganic layer 16 encapsulating the first organic layer 18 and the flake 10. The pigment can also include a second organic layer 18' encapsulating the inorganic layer 16, the first organic layer 18, and the flake 10.

EXAMPLES

Figure 5:
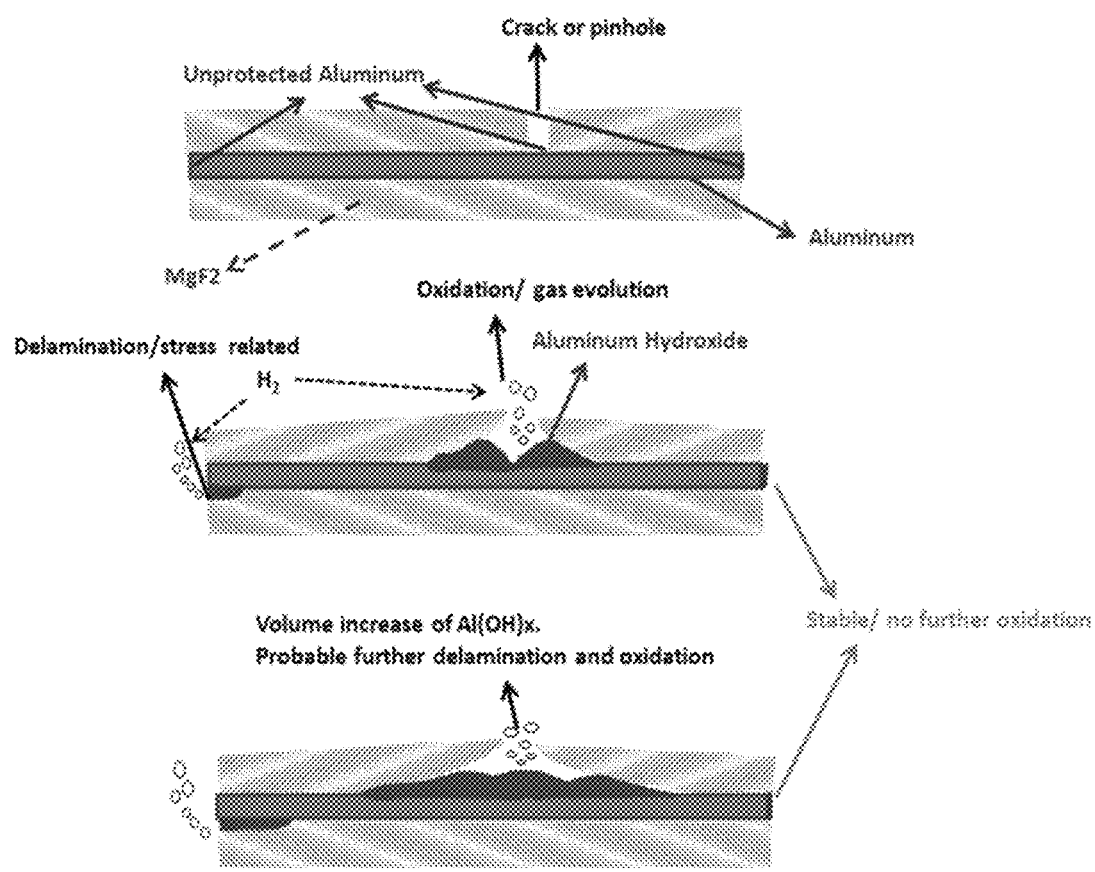
FIG. 5 is a schematic representation of oxidation in a pigment (non-encapsulated) including defects in an external surface of the pigment.
Figure 6:
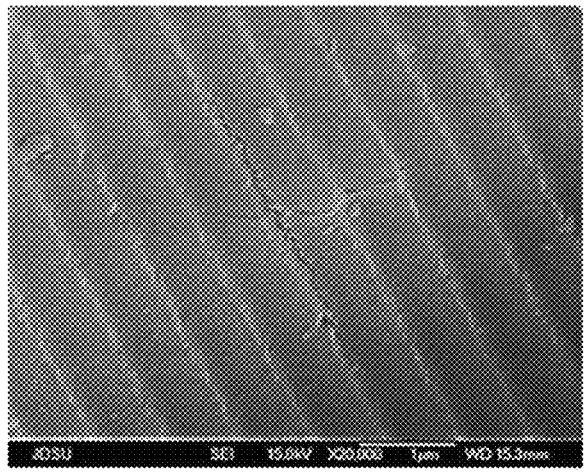
FIGS. 6-9 are SEM micrographs of a pigment (non-encapsulated), as shown in FIG. 5.
Figure 7:
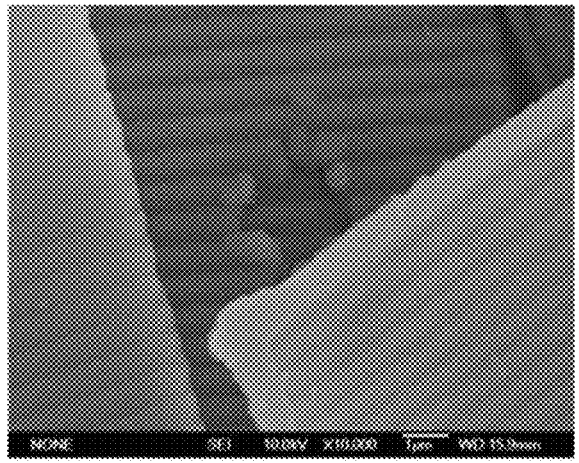
Figure 8:
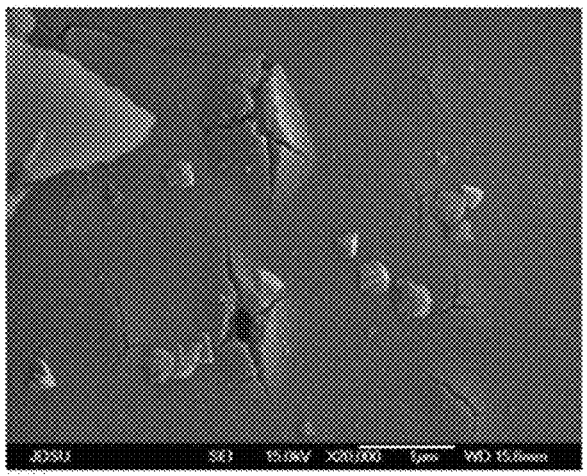
Figure 9:
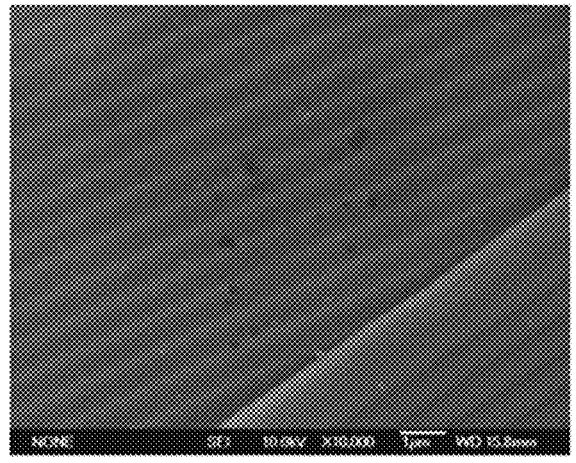

Comparative Example 1—A flake including a central reflector (aluminum) layer between oppositely oriented dielectric layers including magnesium fluoride. As shown in FIG. 5, illustrates a special effect pigment including a central reflector layer, such as aluminum, between two external layers of dielectric material, such as magnesium fluoride. The top layer of magnesium fluoride exhibits a defect, such as crack or pinhole, which has extended through a thickness of the magnesium fluoride layer and exposes the central aluminum layer to the elements. Additionally, the right and left sides of the central reflector layer are open to the air, i.e., are exposed to the elements. The areas of the reflector layer that are exposed to the elements can oxidize producing hydrogen gas and aluminum hydroxide, for example, between the central reflector layer and the top dielectric layer. The oxidation and diffusion of gas will continue possibly resulting in delamination of the layers of the special effect pigment. FIGS. 6-9 are scanning electron microscope (SEM) images showing defects in a surface of various pigments.

Figure 10:
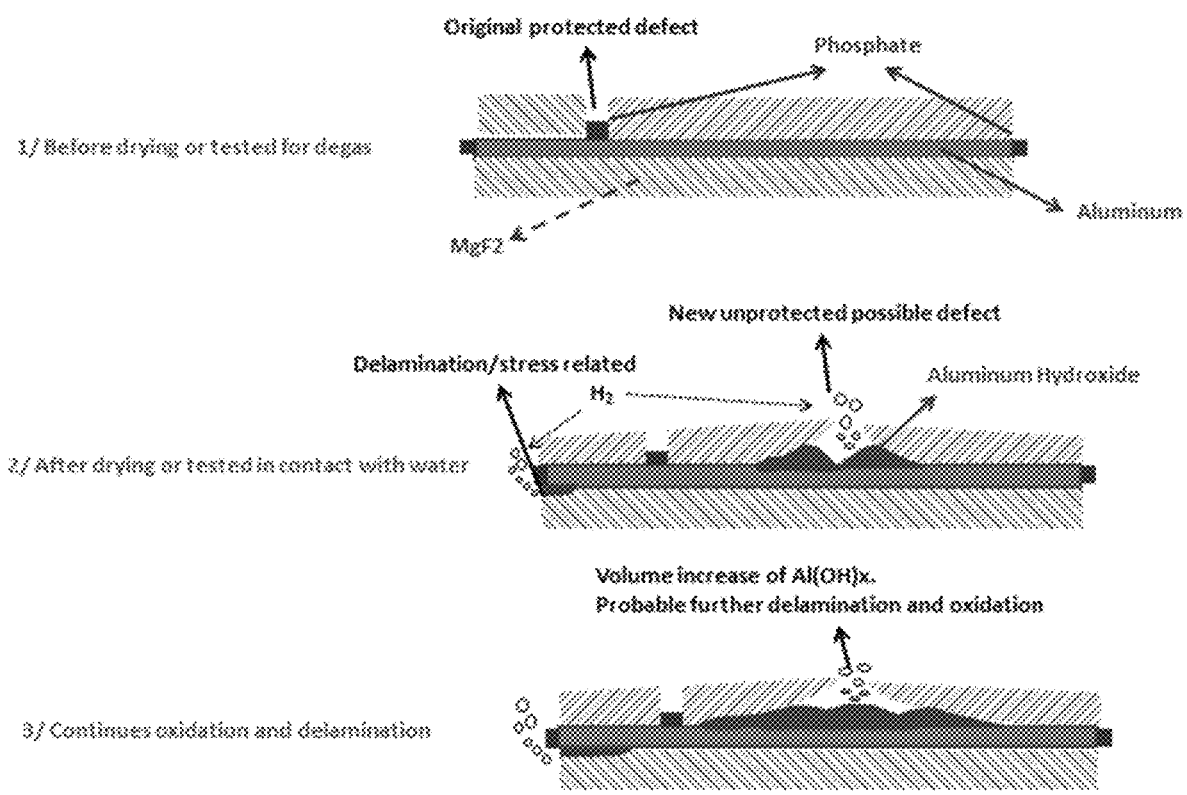
FIG. 10 is a schematic representation of oxidation in an exemplary passivated pigment with a phosphate including defects in an external surface of the pigment.
Figure 11:
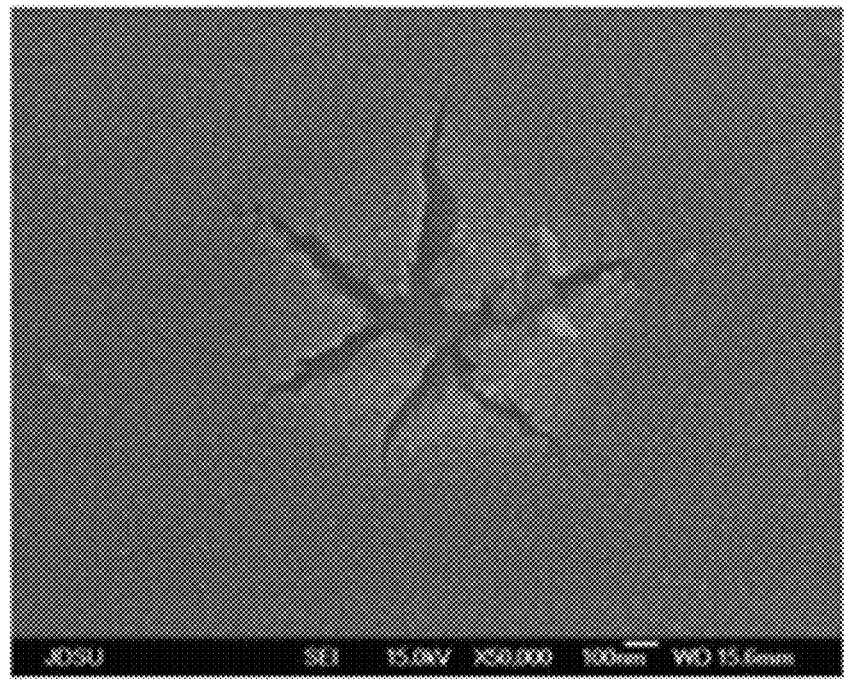
FIG. 11 is a SEM micrograph of the passivated pigment, as shown in FIG. 10.

Comparative Example 2—Prior attempts to correct defects in special effect pigments included chemical treatments, such as phosphates, and external encapsulating layers, such as oxides. FIG. 10 illustrates a schematic in which a special effect pigment with an original defect has been treated with a chemical treatment to repair the defect. However, as shown in FIG. 11, new defects can occur in new areas or around a repaired area. The new defects can be created by shearing forces applied to the surface during handling and/or use of the pigments, such as, spray painting, stirring, transferring between container with power industrial pumps.

Figure 12:
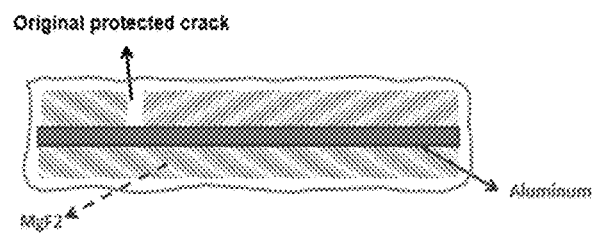
FIGS. 12-13 are schematic representations of a pigment with a single encapsulating external layer.
Figure 13:
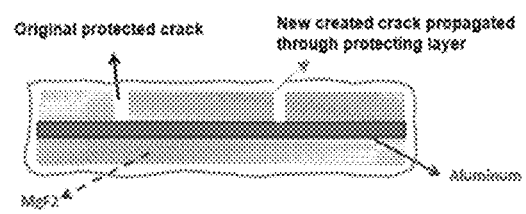
Figure 14:
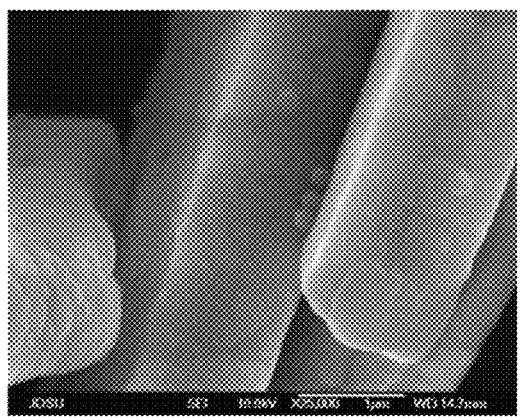
FIGS. 14-15 are SEM micrographs of the pigments, as shown in FIG. 12-13, respectively.
Figure 15:
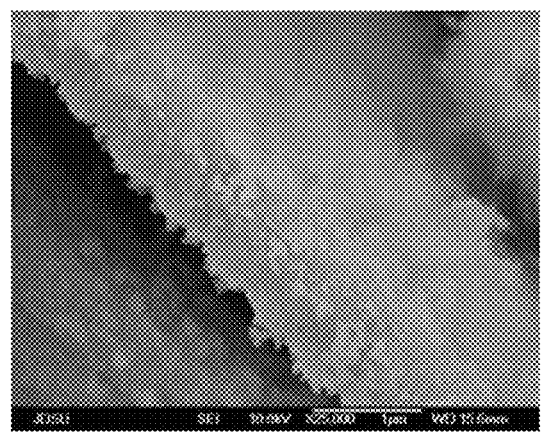

Comparative Example 3—FIG. 12 illustrates a schematic of a single external encapsulating layer of silica in which an original single defect is present extending from a central reflector layer through a single dielectric layer. FIG. 13 is a schematic similar to FIG. 12, but also illustrating an additional defect that extends from the central reflector layer, through a single dielectric layer, and through the single external encapsulating layer of silica. FIGS. 14 and 15 are SEM micrographs of silica encapsulated pigments with defects.

The defects in the pigments, as shown in FIGS. 5-15 allowed oxidation of the central reflector layer, hydroxide formation with hydrogen evolution, and delamination with avalanche oxidation processes.

Examples 1-8—A series of samples were produced with different encapsulation combinations. The flake was diffractive with a 1450 l/mm frequency and 25×25 micron square flake with a three-layer design with approximate thicknesses as follows: 120 nm $MgF_2$/80 nm Al/120 nm $MgF_2$.

The flake was then encapsulated with various layers, such as a polymer layer deposited using layer-by-layer technology, a silica layer deposited using sol-gel encapsulation, or combinations thereof (for example, three encapsulating layers of alternated polymer/silica layers for a total of three layers). The polyelectrolytes used were polyallylamine hydrochloride (PAH), and polysodium 4-styrenesulfonate (PSS).

The samples 1-8 that were studied are described as follows (the designation "first layer", "second layer", and "third layer" below and in Table 1 is used to designate the physical position of the layer from the flake outward and is not intended to otherwise provide any description of the layers):

1. (Comparative) 70 g batch of the flake encapsulated with a first layer including 2 bilayers of PSS/PAH (PSS/PAH/PSS/PAH);
2. (Comparative) 45 g batch of sample 1 further encapsulated with a second layer including silica sol-gel (35% WR recipe—a silica sol gel encapsulation obtained with 175 g of TEOS (tetraethyl orthosilicate) which is the precursor for the formation of the silica layer)
3. (Comparative) 200 g batch of the flake encapsulated with a first layer including silica sol-gel encapsulated (35% WR recipe—using 175 g of TEOS, but because the batch was bigger (200 g), the silica layer should be thinner) without functional material;
4. 200 g batch of sample 3 further encapsulated with a second layer including 2.5 bilayers of PAH/PSS (PAH/PSS/PAH/PSS/PAH);
5. 50 g batch of sample 4 further encapsulated with a third layer of 10 nm silica sol-gel encapsulated (15% WR recipe—a silica sol gel encapsulation obtained with 75 g of TEOS) without functional material;
6. 50 g batch of sample 4 further encapsulated with a third layer of 50 nm silica sol-gel encapsulated (35% WR recipe—a silica sol gel encapsulation obtained with 175 g of TEOS) without functional material;
7. 50 g batch of sample 4 further encapsulated with a third layer of 20 nm silica sol-gel encapsulated (15% WRS2 recipe—a silica sol gel encapsulation obtained with 75 g of TEOS) with functional material; and
8. 50 g batch of sample 4 further encapsulated with 67 nm silica sol-gel encapsulated (35% WRS2 recipe—a silica sol gel encapsulation obtained with 175 g of TEOS) with functional material.

The samples 1-8 are also described in Table 1 below. The calculated thickness of the silica layers was based on geometrical dimensions of the flake.

TABLE 1

Samples of Articles

| Sample # | Flake | First Layer | Second Layer | Third Layer |
|---|---|---|---|---|
| 1 (comp.) | 120 nm $MgF_2$/ 80 nm Al/ 120 nm $MgF_2$ | 2 bilayers of PSS/PAH | n/a | n/a |
| 2 | Sample 1 | | 68 nm silica | n/a |
| 3 (comp.) | 120 nm $MgF_2$/ 80 nm Al/ 120 nm $MgF_2$ | 20 nm silica | n/a | n/a |
| 4 | Sample 3 | | 2.5 bilayers of PAH/PSS | |
| 5 | Sample 4 | | | 10 nm silica |
| 6 | Sample 4 | | | 50 nm silica |
| 7 | Sample 4 | | | 20 nm silica + silane |
| 8 | Sample 4 | | | 67 nm silica + silane |

The Comparative Examples established that a pigment (dielectric/reflector/dielectric) did not pass gassing tests of BASF+red iron oxide (RIO) or the AXALTA gassing test by itself or with a single silica encapsulating layer. Passing the gassing tests means that a sample does not produce more than 10 ml of gas in a period of 10 days. As discussed below, the encapsulation of a diffractive pigment with a multilayer (first layer, second layer, and third layer) encapsulation film comprising silica/polymer/silica passed the BASF+iron oxide 28-day gassing test and still maintained desirable optical properties.

Gassing Procedure—The equipment used for the gassing test is standard in the paint industry (P. Wibling). It consists of a lower bottle where 300 ml of a formulated paint is introduced and a top bubbler comprising a lower and upper chamber to measure the amount of gas produced during the oxidation. A bubbler system measures the amount of water displaced from the lower to the upper chamber due to H2 pressure built in the lower bottle with the paint formulation. The amount of water displaced is equivalent to the volume of H2 produced during the oxidation.

The samples were tested in BASF waterborne paint with red iron oxide, which is considered to be a worst case scenario because it is well known that iron oxide pigments strongly increase the corrosive effects of water-borne coating. The pigment loading is 20 p/b (pigment to binder ratio) or 2.95% by weight. The pigment samples were mixed and split into two duplicate samples, 300 grams per bottle, and a total of 8.85 grams of pigment. Table 2 shows details of the 20 p/b with red iron oxide waterborne BASF paint formulation. A level of 10 ml or less of H2 degas in 28 days is acceptable as a passing result.

TABLE 2

Red Iron Oxide Waterborne BASF paint formulation

| | |
|---|---|
| WB Paint Base Vehicle | 69.6% |
| Polyurethane Resin | 7.3% |
| Red Iron Oxide Dispersion | 7.8% |
| Pigment Slurry - 46.9% pigment, 16.7% polyester resin, 33.5% butyl cellosolve, 2.9% (20%) DMEA solution | 6.3% |
| Slurry Adjustment - 82.2% polyester resin, 17.8% (20%) DMEA solution | 1.8% |
| Pnp (glycol ether) | 7.2% |

Figure 16:
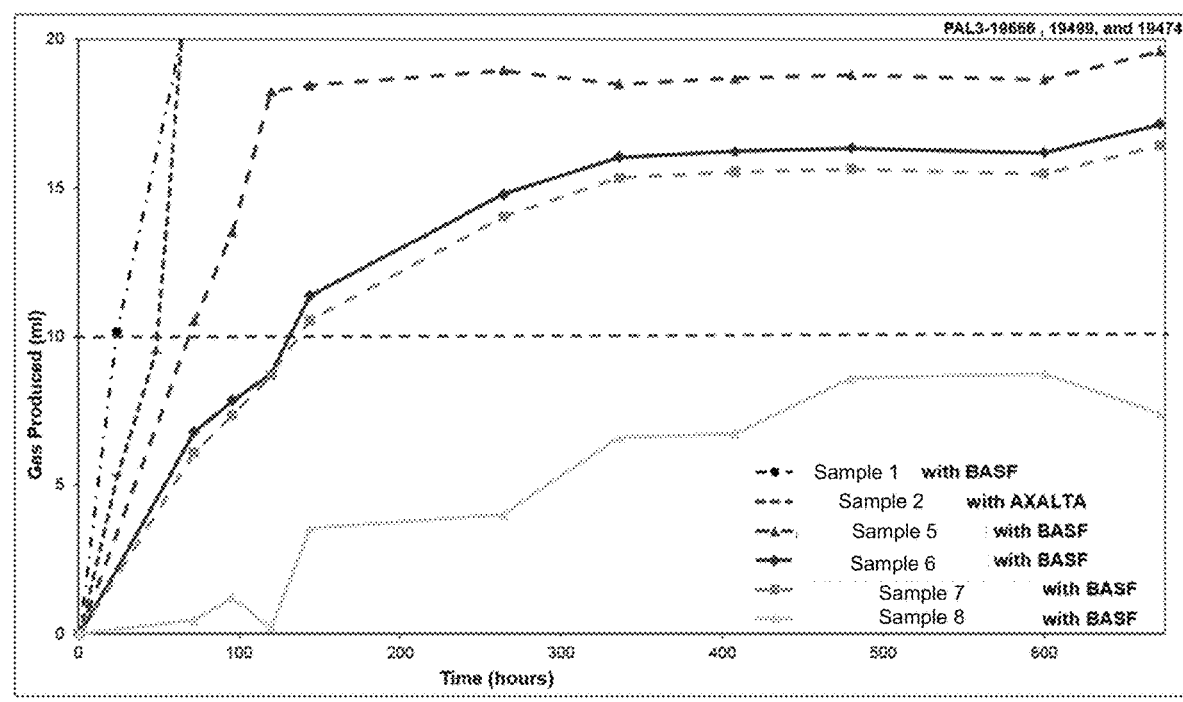
FIG. 16 illustrates a graph of gassing results for a pigment according to an aspect of the invention.

The test was also performed in some cases with the AXALTA waterborne paint using the same equipment described. The gassing results were plotted in FIG. 16, which shows that sample 1 of Table 1 failed the test after only 24 hours. Sample 2 failed the test after only 48 hours with the AXALTA vehicle, which is not as difficult to pass as the BASF+RIO test. Samples 5-7 also failed the gassing test, but these samples were more resistant because the total amount of gas produced stabilized between 15 and 18 ml after about one week.

Sample 8 passed the gassing test. Sample 8 includes a third encapsulating layer that was thicker than the third layer of sample 7 and included functional material. The multilayer encapsulation coating (inorganic/organic) provided protection against the corrosion of the metal core (aluminum) by serving as a barrier against the ingress of elements (e.g., oxygen, water vapor, hydrogen, bases, acid, liquids).

Figure 17:
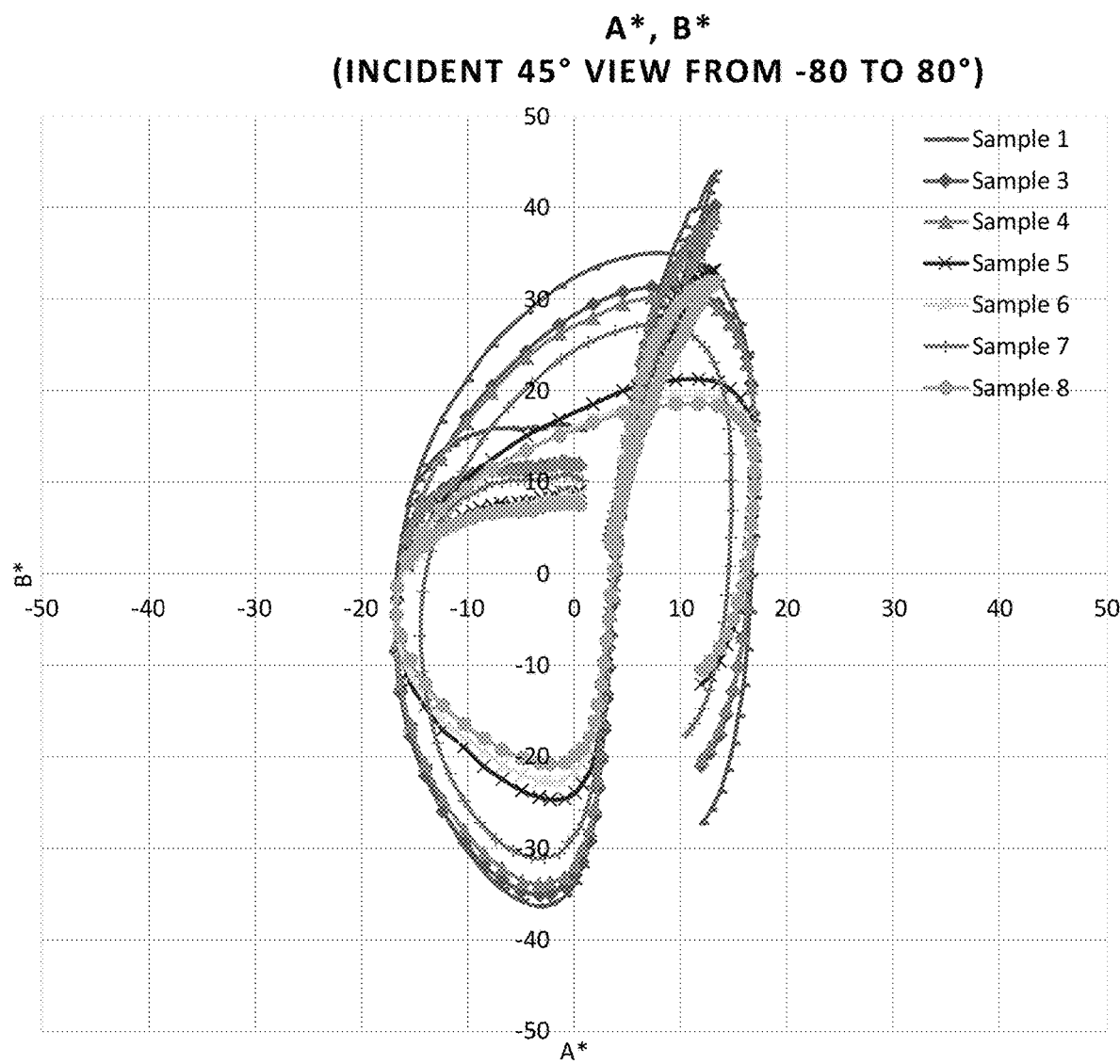
FIG. 17 illustrates the color travel for a plurality of pigments according to an aspect of the invention.
Figure 18:
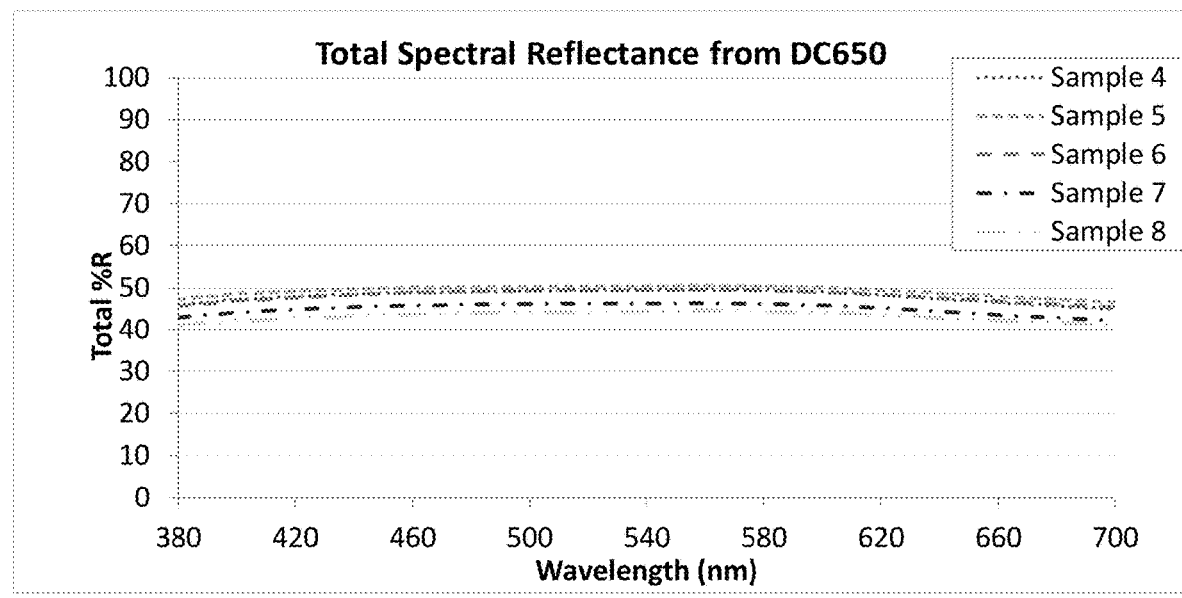
FIG. 18 is a graph of the total spectral reflectance for a plurality of pigments according to an aspect of the invention.
Figure 19:
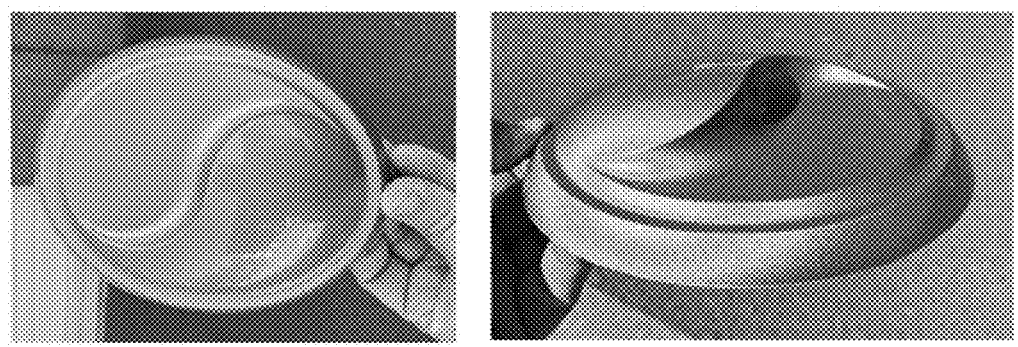
FIG. 19 is two images of a passivated pigment formed into a paint, and applied to a substrate to show interference effects under various lighting conditions.

EXAMPLE 9—A pigment including encapsulating layers can maintain an optical appearance. The color travel of the samples 1-8 were measured with the Murakami goniophotospectrometer, as shown in FIG. 17. The graph shows the color travel when paint drawdowns for each sample were measured with an incident angle of 45 degrees and viewing angles between −80 and 80 degrees. The pigments with the multilayer encapsulation coating (sample 5-8) showed less diffractive performance, but showed a good diffractive interference when exposed to direct illumination. In particular, as shown in FIG. 19, the image on the left was taken in the shade (under diffuse illumination) and the image on the right was taken in sunlight (direct illumination). The pigment (sample 8) was combined with a liquid medium to form a colorant composition, e.g., a water-based spray paint. FIG. 18 illustrates that the sample 4-8 exhibited uniform spectral reflectance over a range of wavelengths of light.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications can be made without departing from the scope of the teachings herein.

This scope disclosure is to be broadly construed. It is intended that this disclosure disclose equivalents, means, systems and methods to achieve the devices, activities and mechanical actions disclosed herein. For each device, article, method, mean, mechanical element or mechanism disclosed, it is intended that this disclosure also encompass in its disclosure and teaches equivalents, means, systems and methods for practicing the many aspects, mechanisms and devices disclosed herein. The claims of this application are likewise to be broadly construed. The description of the inventions herein in their many embodiments is merely exemplary in nature and, thus, variations that do not depart from the gist of the invention are intended to be within the scope of the invention. Such variations are not to be regarded as a departure from the spirit and scope of the invention.

What is claimed is:

1. A pigment, comprising:
   a flake including a metal core having a first surface and a second surface, a first dielectric layer interfacing with a first surface of the metal core, and a second dielectric layer interfacing with a second surface of the metal core;
   a first organic layer encapsulating the flake; and
   an inorganic layer encapsulating the first organic layer.

2. The pigment of claim 1, wherein the first organic layer interfaces with the flake.

3. The pigment of claim 1, wherein the inorganic layer is a layer of silica.

4. The pigment of claim 1, wherein the first organic layer is a multilayer including a first organic sublayer interfacing with a second organic sublayer.

5. The pigment of claim 1, wherein the inorganic layer interfaces with the first organic layer.

6. The pigment of claim 1, wherein the first organic layer is a multilayer including alternating layers of a first organic sublayer interfacing with a second organic sublayer.

7. The pigment of claim 1, wherein the first organic layer includes one or more polyelectrolytes.

8. The pigment of claim 7, wherein the polyelectrolyte is chosen from polyallylamine hydrochloride, polysodium 4-styrenesulfonate, and combinations thereof.

9. The pigment of claim 1, wherein the first organic layer includes a colorant.

10. The pigment of claim 1, wherein the first organic layer is multiple alternating layers of charged material.

11. The pigment of claim 1, further comprising a second organic layer encapsulating the flake.

12. The pigment of claim 11, wherein the second organic layer interfaces with the inorganic layer.

13. The pigment of claim 11, wherein the inorganic layer includes an inorganic material chosen from oxides, nitrides, carbides, sulfides, compounds thereof, and combinations thereof.

14. A method of making a pigment, comprising:
providing a flake;
applying a first organic layer to encapsulate the flake; and
applying an inorganic layer to encapsulate the flake and the first organic layer.

15. The method of claim 14, further comprising, after applying the inorganic layer, applying a second organic layer to encapsulate the flake, the first organic layer, and the inorganic layer.

16. The method of claim 14, wherein the inorganic layer has a negative or positive charge and is attracted to a positive or negative charge of the first organic layer.

17. The method of claim 14, wherein the pigment includes multiple interfaces to reduce propagation of cracks and increase the diffusion path of corrosives molecules.

18. The method of claim 14, wherein the inorganic layer is applied using a sol-gel process.

19. The method of claim 14, wherein the organic layer is applied using a layer-by-layer process.

* * * * *